United States Patent
Schmidt et al.

(10) Patent No.: US 9,092,349 B2
(45) Date of Patent: Jul. 28, 2015

(54) STORAGE OF CODEWORD PORTIONS

(75) Inventors: Jonathan E. Schmidt, New Westminster (CA); Scott Nelson, Vancouver (CA); Zion S. Kwok, Burnaby (CA)

(73) Assignee: Intel Corporation, Santa Clara, CA (US)

(*) Notice: Subject to any disclaimer, the term of this patent is extended or adjusted under 35 U.S.C. 154(b) by 241 days.

(21) Appl. No.: 13/991,400

(22) PCT Filed: Dec. 14, 2011

(86) PCT No.: PCT/US2011/065006
§ 371 (c)(1),
(2), (4) Date: Jun. 3, 2013

(87) PCT Pub. No.: WO2013/089715
PCT Pub. Date: Jun. 20, 2013

(65) Prior Publication Data
US 2014/0089760 A1  Mar. 27, 2014

(51) Int. Cl.
*G11C 29/00* (2006.01)
*G06F 11/10* (2006.01)
*G11C 29/42* (2006.01)

(52) U.S. Cl.
CPC ............ *G06F 11/10* (2013.01); *G06F 11/1044* (2013.01); *G11C 29/42* (2013.01)

(58) Field of Classification Search
CPC ...... G06F 11/10; G06F 11/1044; G11C 29/42
USPC .......................... 714/746, 763–764, 769–770
See application file for complete search history.

(56) References Cited

U.S. PATENT DOCUMENTS

| | | | | |
|---|---|---|---|---|
| 8,438,453 | B2 * | 5/2013 | Post et al. | 714/763 |
| 8,533,549 | B2 * | 9/2013 | Kondo et al. | 714/733 |
| 8,626,988 | B2 * | 1/2014 | Steiner et al. | 711/103 |
| 2010/0223530 | A1 | 9/2010 | Son et al. | |
| 2010/0269017 | A1 | 10/2010 | Bueb | |
| 2011/0209028 | A1 | 8/2011 | Post et al. | |
| 2011/0239088 | A1 | 9/2011 | Post et al. | |

OTHER PUBLICATIONS

International Preliminary Report of Patentability in PCT Patent Application No. PCT/US2011/065006, mailed Jun. 26, 2014, 4 pages.
International Search Report and Written Opinion for PCT/US2011/065006, mailed Aug. 24, 2012, 7 pages.

* cited by examiner

*Primary Examiner* — Shelly A Chase
(74) *Attorney, Agent, or Firm* — Schwabe, Williamson & Wyatt, P.C.

(57) ABSTRACT

Embodiments of the present disclosure describe device, methods, computer-readable media and system configurations for dividing error correcting code ("ECC") codewords into portions and storing the portions among multiple die of non-volatile memory ("NVM"). For example, a device may include memory including a first die and a second die, and a memory controller configured to store a first portion of a codeword for use with an error correcting code in a first segment of the first die and to store a second portion of the codeword in a first segment of the second die. In various embodiments, the first segment of the second die may be offset from the first segment of the first die. Other embodiments may be described and/or claimed.

22 Claims, 9 Drawing Sheets

STORAGE OF CODEWORD PORTIONS

CROSS REFERENCE TO RELATED APPLICATION

The present application is a national phase entry under 35 U.S.C. §371 of International Application No. PCT/US2011/065006, filed Dec. 14, 2011, entitled "STORAGE OF CODEWORD PORTIONS," which designates the United States of America and the entire contents and disclosures of which are hereby incorporated by reference in their entireties.

FIELD

Embodiments of the present disclosure relate generally to the field of data processing, and more particularly, to error correction in memory.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure. Unless otherwise indicated herein, the approaches described in this section are not prior art to the claims in the present disclosure and are not admitted to be prior art by inclusion in this section.

As sizes of non-volatile memory ("NVM") devices decrease, e.g., by using advanced lithography techniques, bit error rates of the devices may increase. A memory controller may use a variety of error correction techniques, including an error correcting code ("ECC") such as forward ECC, to handle bit errors and recover data. While an ECC engine may be equipped to handle up to a particular worst-case raw bit error rate ("RBER"), it may spend the majority of its time operating well below this worst-case RBER.

There may be a large amount of RBER variance between memory devices of a population. The variance may be based on various factors. Some bit errors may be entirely random and independent. Other bit errors may be correlated with operating conditions such as cycling, retention time, temperature, process variability and so forth. Some factors that may affect RBER, such as localized oxide thickness, may be hidden. Other factors that may affect RBER, such as program/erase cycle count, may be observable. Because of the large number of factors that may affect RBER, error count distribution among a population of NVM devices may be non-binomial, and the RBER distribution may be relatively wide. The errors may tend to cluster in a few areas, rather than being spread out evenly.

A die may fail for various reasons, such as solder joint failure, lead frame failure, memory short out, etc. Exclusive-or ("XOR") recovery techniques may be used to correct bit errors cause by catastrophic die failures. ECCs may be used to protect against normal RBER that occurs in every NVM device.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "module" may refer to, be part of, or include an Application Specific Integrated Circuit ("ASIC"), an electronic circuit, a processor (shared, dedicated, or group) and/or memory (shared, dedicated, or group) that execute one or more software or firmware programs, a combinational logic circuit, and/or other suitable components that provide the described functionality. As used herein, "computer-implemented method" may refer to any method executed by one or more processors, a computer system having one or more processors, a mobile device such as a smart phone (which may include one or more processors), a tablet, laptop computer, a set-top box, a gaming console, and so forth.

In various embodiments, a device may include memory including a first die and a second die. The device may also include a memory controller configured to store a first portion of a codeword for use with an error correcting code ("ECC") in a first segment of the first die and to store a second portion of the codeword in a first segment of the second die. In various embodiments, the first segment of the second die may be offset (physically or logically) from the first segment of the first die. Systems and methods for performing similar operations may also be disclosed.

In various embodiments, the codeword may be a first codeword. The memory controller may be further configured to store a first portion of a second codeword for use with the ECG in a second segment of the second die, and to store a second portion of the second codeword in a second segment of the first die. In various embodiments, the second segment of the second die may be offset from the second segment of the first die, physically and/or logically.

In various embodiments, the first segment of the first die may be "vertically aligned" with the second segment of the second die. As used herein, segments of die may be "vertical aligned" where an exclusive-or ("XOR") operation is performed with the two segments. In various embodiments, the second segment of the first die may be vertically aligned with the first segment of the second die.

Figure 1:
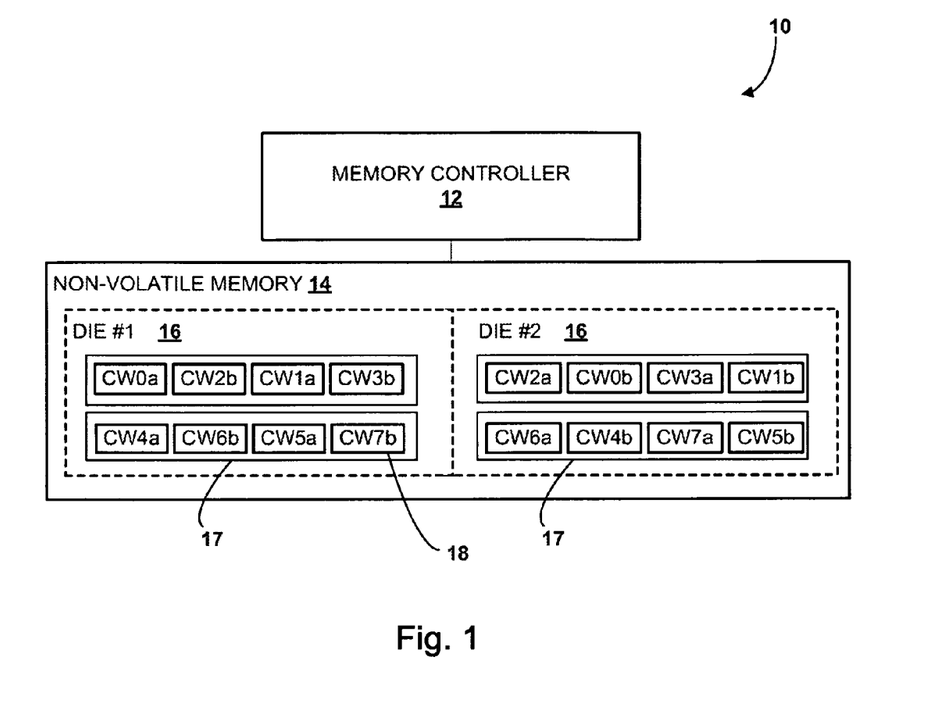
FIG. 1 schematically illustrates example codewords, for use with an error correcting code ("ECC"), stored among multiple die, in accordance with various embodiments.

Referring now to FIG. 1, an example memory device 10 includes a memory controller 12 operably coupled to non-volatile memory ("NVM") 14. In various embodiments, memory controller 12 may be software loaded into NVM 14 and executed by one or more processors (not shown) to control access to NVM 14. In other embodiments, memory controller 12 may be implemented using hardware (e.g., a digital circuit), or using a combination of hardware and software. In some embodiments, NVM 14 may be NAND flash memory. In various embodiments, NVM 14 may be other types of memory, such as ferroelectric random-access memory ("FeTRAM"), nanowire-based NVM, phase change memory ("PCM"), and so forth.

The term "memory device" may be used herein to refer to any device having a memory controller (e.g., 12) in software or hardware form and NVM (e.g., 14). In some embodiments, a memory controller and NVM may be packaged together into a memory device in the form of an integrated circuit that may be installed into a computing device such as a tablet or mobile telephone.

NVM 14 may include various numbers of die 16. In this example, NVM 14 includes two die 16, labeled "DIE #1" and DIE #2." More or fewer die 16 may be included in NVM 14. Two die 16 are included in FIG. 1 for illustrative purposes only. Each die 16 includes two "pages" 17 of memory. As with the number of die, it should be understood that an NVM die may include any number of pages 17. Two pages 17 are shown here for illustrative purposes only.

In a population of memory devices, storing undivided error ECC codewords in die of memory may result in a bit error count distribution of the population of devices being non-binomial. In contrast, dividing ECC codewords into portions and storing those portions among multiple die of each device may cause the bit error count distribution of the population to become more binomial and/or have a tighter distribution. In some embodiments, portions of an ECC codeword may not themselves be codewords or used individually as codewords. In such embodiments, portions of an ECC codeword may be combined, jointly decoded and/or otherwise used in conjunction for ECC purposes.

An example of portions of codewords being stored among multiple die is shown in FIG. 1. Eight ECC codewords, CW0-CW7, are shown stored in NVM 14. Rather than storing a codeword on a single die 16, each codeword is divided into two portions and stored in segments 18 of multiple die 16. For example, CW0 is split into CW0a and CW0b, which are stored in segments of DIE #1 and DIE #2. Likewise, CW1 is split into CW1a and CW1b, which are stored in segments 18 of DIE #1 and DIE #2.

The example of FIG. 1 is merely illustrative, and codewords may be divided into other numbers of portions and distributed among other numbers of die. For example, assume a codeword is divided into n portions. In some embodiments, the n portions may be stored in segments of n separate die. In other embodiments, the n portions may be may be stored in segments of n/2 or n/4 separate die, and so forth. The more die used, the narrower the RBER distribution for a codeword.

Codeword portions may be distributed among multiple die in various ways. In various embodiments, rather than being stored in corresponding segments of the die (e.g., in the top left segments of each die), portions of a codeword may be stored in segments of die that are offset from each other. In various embodiments, memory segments may be "offset" from each other if they occupy different memory addresses on their respective components (e.g., die, page, etc.). For example, in some embodiments with NAND, memory segments may be "offset" from each other if they occupy different column addresses within their respective pages.

Examples of memory segments being offset are seen in FIG. 1. CW0b is stored in the second segment 18, top row of DIE #2. This is offset from the first segment 18, top row of DIE #1, in which CW0a is stored. Likewise, a segment 18 of the DIE #2 storing CW2a (top left) is offset from a segment of the DIE #1 storing. CW2b (top, second from left).

In various embodiments, segments of a die storing portions of codewords may be vertically aligned with segments of other die storing corresponding portions of other codewords. For example, a segment of a first die (e.g., DIE #1) storing a first portion of a codeword (e.g., CW0a, CW1a) may be vertically aligned with a segment of a second die (e.g., DIE #2) storing a first portion of another codeword (e.g., CW2a, CW3a). Likewise, a segment of the first die (e.g., DIE #1) storing a second portion of a codeword (e.g., CW2b, CW3b) may be vertically aligned with a segment of the second die (e.g., DIE #2) storing a second portion of another codeword (e.g., CW0b, CW1b). The codeword portions in those vertically aligned segments may be XOR'd to yield a decodable XOR die, which will be described in more detail below.

While shown physically offset from and/or vertically aligned with each other in FIG. 1, in various embodiments, codeword portions may be offset from or vertically aligned with each other logically instead. For example, second halves of codewords may be stored on a second die in the same segments as first halves are stored on a first die, but the contents of the second die may be rotated, e.g., before applying an XOR operation.

Figure 2:
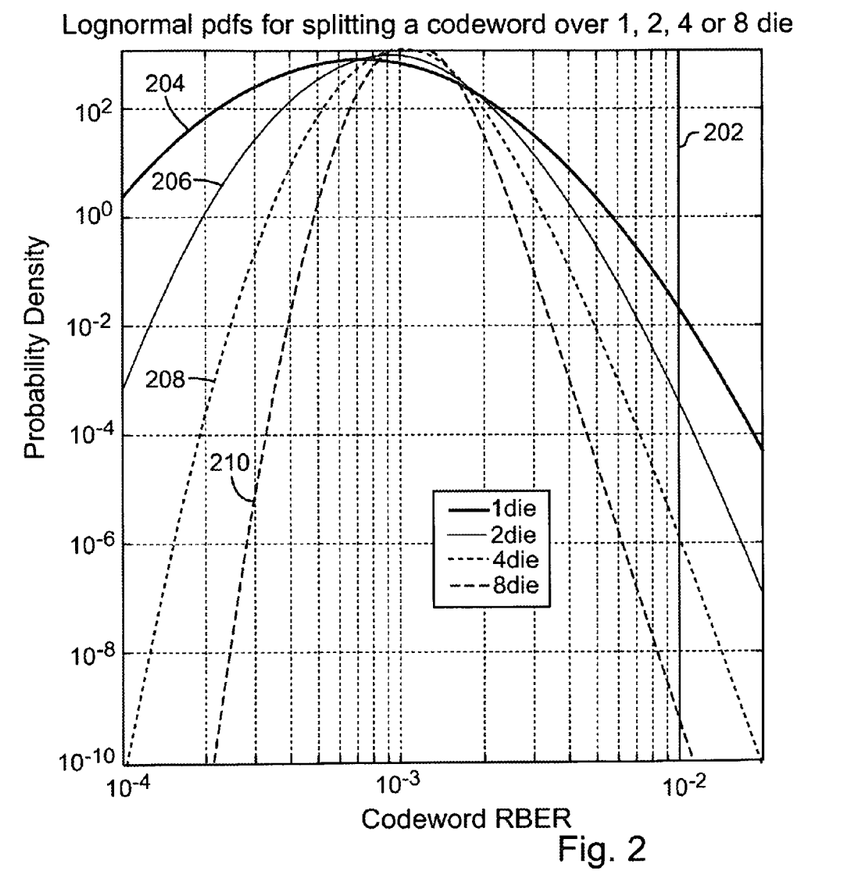
FIG. 2 depicts example raw bit error rate ("RBER") distributions that may result from storing ECC codewords among multiple die of memory, in accordance with various embodiments.

Example codeword RBER distributions for various populations of memory devices are represented by a series of curves in FIG. 2. The Y-axis represents probability density and the X-axis represents codeword RBER. Each curve represents a codeword RBER distribution of a population of memory devices in which codewords are stored among a particular number of die of memory. Error correlation and clustering have been included in the probability models.

The strength of an ECC implemented for the populations is represented by a vertical line 202. Codeword RBER to the left of ECC line 202 is considered correctable. Codeword RBER to the right of ECC line 202 is considered uncorrectable. The stronger the ECC, the further to the right ECC line 202 is moved.

A first curve 204 represents codeword RBER distribution of a population of memory devices in which undivided ECC codewords are stored in a single block on a single die. A second curve 206 represents codeword RBER distribution of a population of memory devices in which ECC codewords are stored among two die. A third curve 208 represents codeword RBER from memory devices in which ECC codewords are stored among four die. A fourth curve 210 represents codeword RBER from memory devices in which ECC codewords are stored among eight die. It can be seen in FIG. 2 that as the number of die among which ECC codewords are distributed increases, the widths of the curves decrease.

The areas underneath the curves to the right of the ECC line 202 represent memory devices of each population that experience uncorrectable RBER, and thus may be considered to have failed. Depending on a variety of factors, such as how a memory device may be used, there may be a threshold failure percentage. A failure rate beyond this threshold may be intolerable.

For example, the area underneath first curve 204 to the right of ECC line 202 is relatively large compared to the areas underneath the other curves, and may represent a failure rate that is intolerable to a memory device manufacturer. Accordingly, the manufacturer may configure a memory controller (e.g., 12) to divide ECC codewords into two portions each and store those portions on separate blocks of separate die, which may result in the codeword RBER distribution represented by second curve 206. The area underneath second curve 206 to the right of ECC line 202 is considerably smaller than the area underneath first curve 204 to the right of ECC line 202, which means a lower failure rate. If this new failure rate is still unacceptable, the manufacturer may increase the number of die among which an ECC codeword is stored to obtain even lower failure rates, as shown by third curve 208 and fourth curve 210.

In some cases, a memory device manufacturer may be able to tolerate a particular number or percentage of failed memory devices. In such cases, too low a number or percentage of failed memory devices may suggest that the manufacturer is expending too many resources (e.g., materials, labor) to ensure an unjustifiably high number or percentage of non-failing memory devices. For example, in FIG. 2, the area underneath fourth curve 210 to the right of ECC line 202 is smaller than perhaps is warranted to make the memory device marketable or adequate for a particular purpose.

To save costs, the manufacturer may alter a device or manufacturing in various ways, such as by decreasing lithography size, increasing a memory write speed, and using cheaper materials and/or simpler processes, to bring an actual memory device failure rate as close as possible to a tolerable memory device failure rate. Increasing codeword RBER in memory devices of a population may shift the codeword RBER distribution curve produced by that population to the right. For example, codeword RBER could be raised in the memory device population that produced fourth curve 210 (e.g., by increasing a write speed of the memory) to shift that curve to the right. This may increase the area underneath fourth curve 210 to the right of ECC line 202 to be closer to a tolerable number of failed devices.

Figure 3:
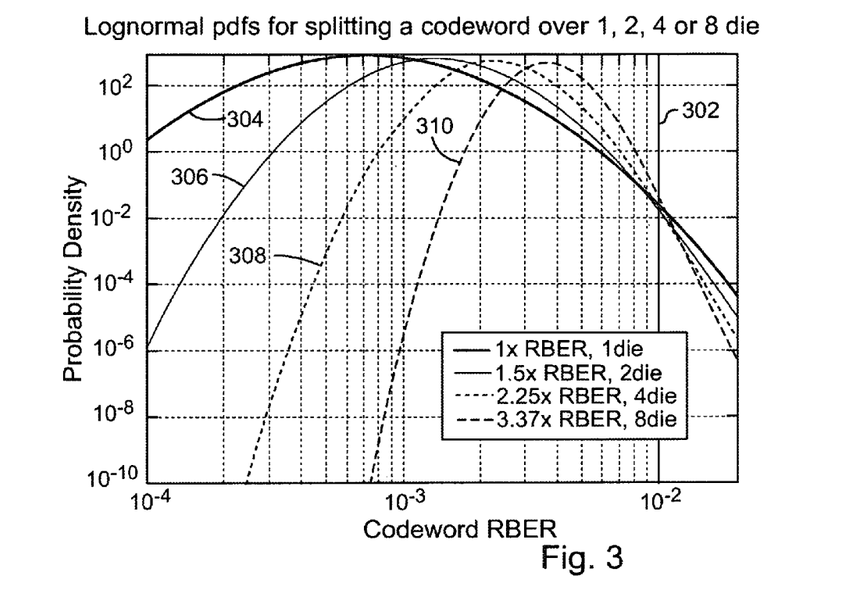
FIG. 3 depicts example RBER distributions that may result from storing ECC codewords among multiple die of memory and increasing RBER, in accordance with various embodiments.

Examples of this are seen in FIG. 3, which depicts curves similar to those shown in FIG. 2, except that the codeword RBER of the populations of memory devices have been modified to shift the curves to the right. For example, the codeword RBER that produced second curve 306 in FIG. 3 has been increased by 50% from that of the population of memory devices that produced second curve 206 in FIG. 2. Similarly, the codeword RBER of a population of memory devices producing third curve 308 in FIG. 3 has been increased by 125% from that of the memory devices that produced third curve 208 in FIG. 2. Likewise, the RBER of a population of memory devices producing fourth curve 310 in FIG. 3 has been increased by 237% from that of the memory devices that produced fourth curve 210 in FIG. 2. The RBER of a population of memory devices producing first curve 304 in FIG. 3, on the other hand, has not been increased from that of the memory devices that produced first curve 204 in FIG. 2.

Each of the shifted curves of FIG. 3 crosses the ECC line 302 at approximately the same probability density level. The areas beneath these curves are substantially similar. Assuming those areas represent tolerable failure rates, FIG. 3 demonstrates that a memory device manufacturer may manipulate multiple variables, including the number of die among which ECC codewords are stored and the amount of error experienced by a population of memory devices, to achieve a tolerable failure rate.

Another variable that may be manipulated by a memory device manufacturer to achieve a tolerable failure rate is a strength of an ECC that is implemented in a population of memory devices. In FIGS. 2 and 3, increasing the strength of the ECC (e.g., by another, stronger ECC from a plurality of potential ECCs) may move ECC lines 202 and 302 to the right in FIGS. 2 and 3, respectively. Decreasing ECC strength (e.g., by selecting a weaker ECC from a plurality of ECCs) may move ECC lines 202 and 302 to the left in FIGS. 2 and 3, respectively. For example, a weaker ECC may be selectively implemented in the population of memory devices that produced fourth curve 210 in FIG. 2 to move ECC line 202 to the left, so that the area underneath fourth curve 210 to the right of ECG line 202 grows to a tolerable failure rate. Selecting a weaker ECC may reduce required resources such as computing cycles, and therefore may increase overall performance of a memory device. For example, a weaker ECC may require fewer parity bytes, which may mean less memory overhead.

In many ECCs, XOR recovery calculations may be utilized to perform error correction. For example, die segments that are vertically-aligned, logically or physically, may be XOR'd. Disclosed techniques may be compatible with existing XOR calculations. For example, if a codeword is divided into n portions by a memory controller, XOR results generated by the memory controller may include a multiple of n codewords (as an XOR result may include a whole codeword).

Figure 4:
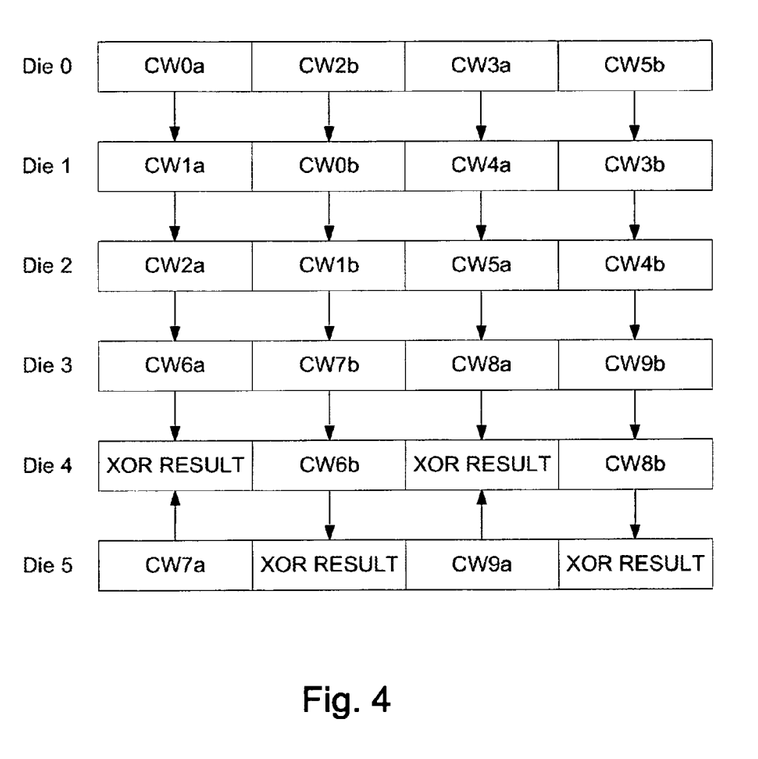
FIG. 4 schematically depicts an example scheme for distributing codeword portions among multiple die, in accordance with various embodiments.

FIG. 4 depicts an example scheme for distributing portions of multiple codewords, CW0-CW, among six die, DIE 0-DIE 5. As with the example of FIG. 1, portions of a particular codeword may be stored in segments of die that are offset from each other, physically and/or logically. However, rather than storing XOR results in a single die, XOR results may be distributed among multiple die. In various embodiments, the contents of the XOR results may be distributed among (n+1) die, where n is the number of portions into which codewords are divided.

For example, in DIE 4 of FIG. 4, the first and third segments store XOR results of the first segments and the third segments, respectively, of the other five die. This is shown by the arrows between the first segments and the arrows between the third segments. The second and fourth segments of DIE 4, in contrast, are used to store CW6b and CW8b, respectively. Similarly, in DIE 5, the first and third segments store codeword portions, CW7a and CW9a, whereas the second and fourth segments store XOR results of the second, and fourth segments of the other die.

Figure 5:
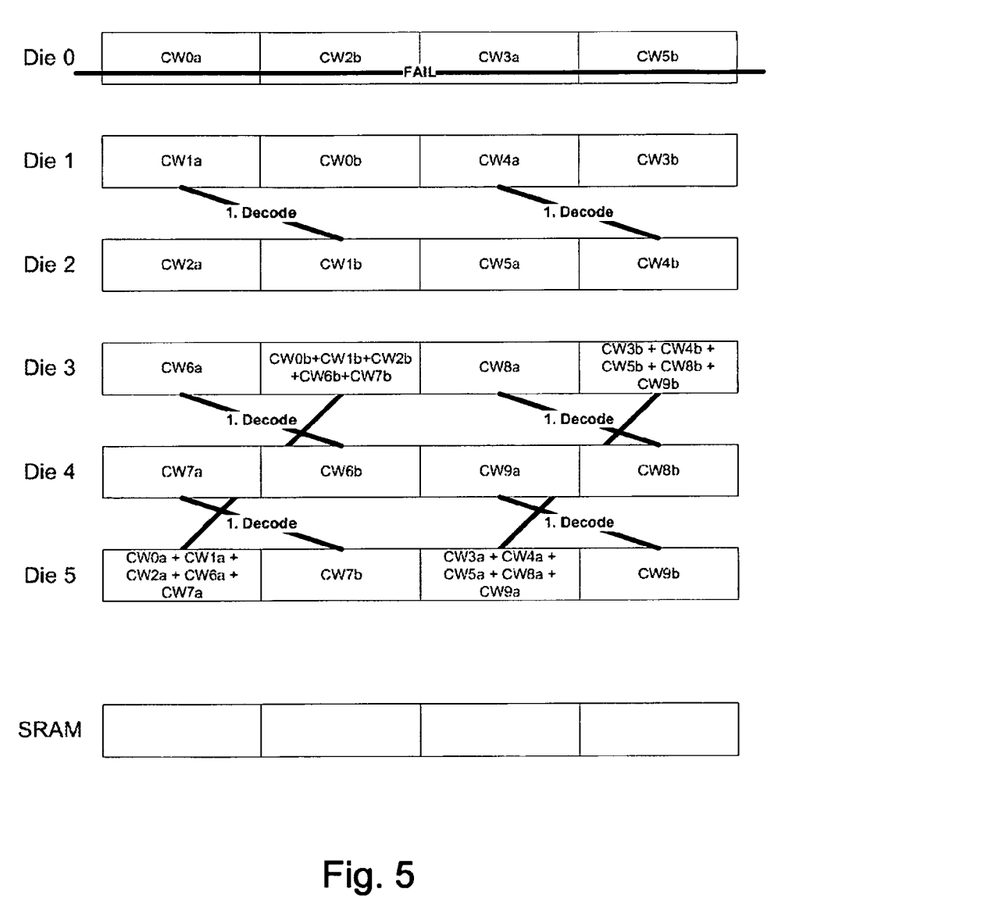
FIGS. 5-7 schematically depict another example scheme for distributing codeword portions among multiple die, as well as example operations for reconstructing codewords after die failure, in accordance with various embodiments.
Figure 6:
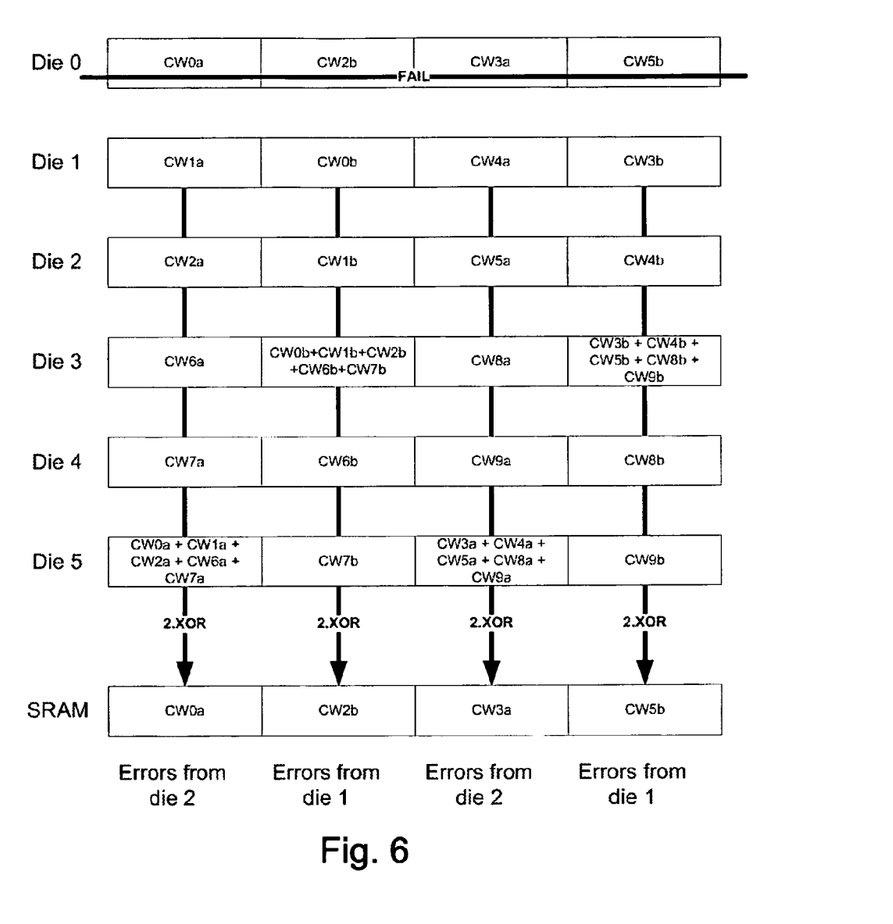
Figure 7:
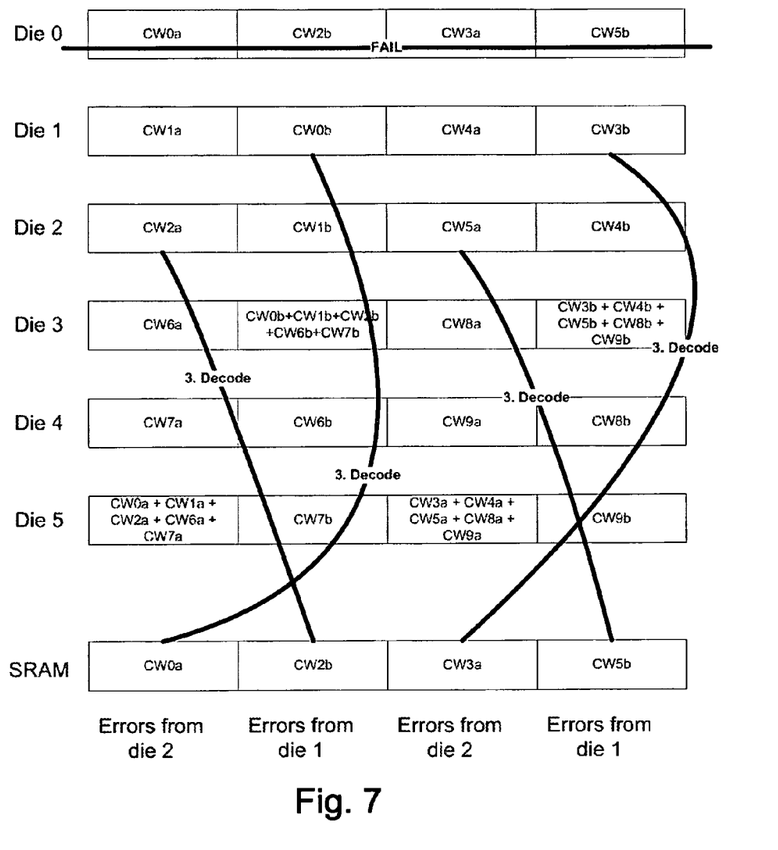

FIGS. 5-7 depict another example scheme for distributing portions of multiple codewords, CW0-CW9, among six die, DIE 0-DIE 5. As with the example of FIGS. 1 and 4, portions of a particular codeword may be stored in segments of die that are offset from each other, physically and/or logically. And like FIG. 4, the contents of the XOR die may be distributed among multiple die, in this case DIE 3 and DIE 5. FIGS. 5-7 also depict a series of error detection and correction operations that may be performed to reconstruct codewords after die failure.

In FIG. 5, DIE 0 has failed. DIE 0's failure may mean the codeword portions CW0a, CW2b, CW3a and CW5b are unavailable to be decoded with their counterparts, CW0b, CW2a, CW3b and CW5a, respectively. Accordingly, codewords CW0, CW2, CW3 and CW5 may need to be reconstructed. As a first step of reconstruction, and as shown in FIG. 5, the other codewords may be decoded because their portions are available. This decoding operation may correct any bit errors in those codewords, so that after the decoding, CW1, CW4 and CW6-9 may be free of errors. Similarly, the XOR results involving these codewords may also be free of errors.

A separate memory area is shown below DIE 0-5, but in various embodiments may not be utilized until the next step, shown in FIG. 6. This extra memory area may be implemented in various ways. For instance, it may be implemented in volatile memory, such as static random access memory ("SRAM") of a NVM controller.

In FIG. 6, XOR operations are performed as indicated by the arrows so that the codeword portions in each column, as well as an original XOR result in the column, are all XOR'd. The result may be the errors from various die, and may be equivalent to or usable to compute the codeword portion from failed DIE 0.

For example, in the first column, CW1a, CW2a, CW6a and CW7, as well as an original XOR result of CW0a, CW1a, CW2a, CW6a and CW7a stored on DIE 5, are XOR'd. The XOR result, shown stored in SRAM, may be the errors from DIE 2, which may be equivalent to or usable to compute the value of the codeword portion CW0a from failed DIE 0.

As another example, in the second column, CW0b, CW1b, CW6b, CW7b, as well as an original XOR result of CW0b, CW1b, CW2b, CW6b and CW7b stored on DIE 3, are XOR'd. The XOR result, shown stored in SRAM, may be the errors from DIE 1, which may be equivalent to or usable to compute the value of the codeword portion CW2b from failed DIE 0.

Once the missing codeword portions are reconstructed and available, then as shown in FIG. 7, the reconstructed codeword portions stored in SRAM may be decoded with their counterparts to reconstruct codewords. For example, CW0b's counterpart was CW0a on failed DIE 0. But after the XOR shown in FIG. 6, CW0a has been reconstructed and stored in SRAM. CW0b on DIE 1 therefore may be decoded with CW0a on SRAM to correct any errors in CW0. Similar operations may occur for other codewords affected by the failure of DIE 0, including CW2, CW3 and CW5.

Figure 8:
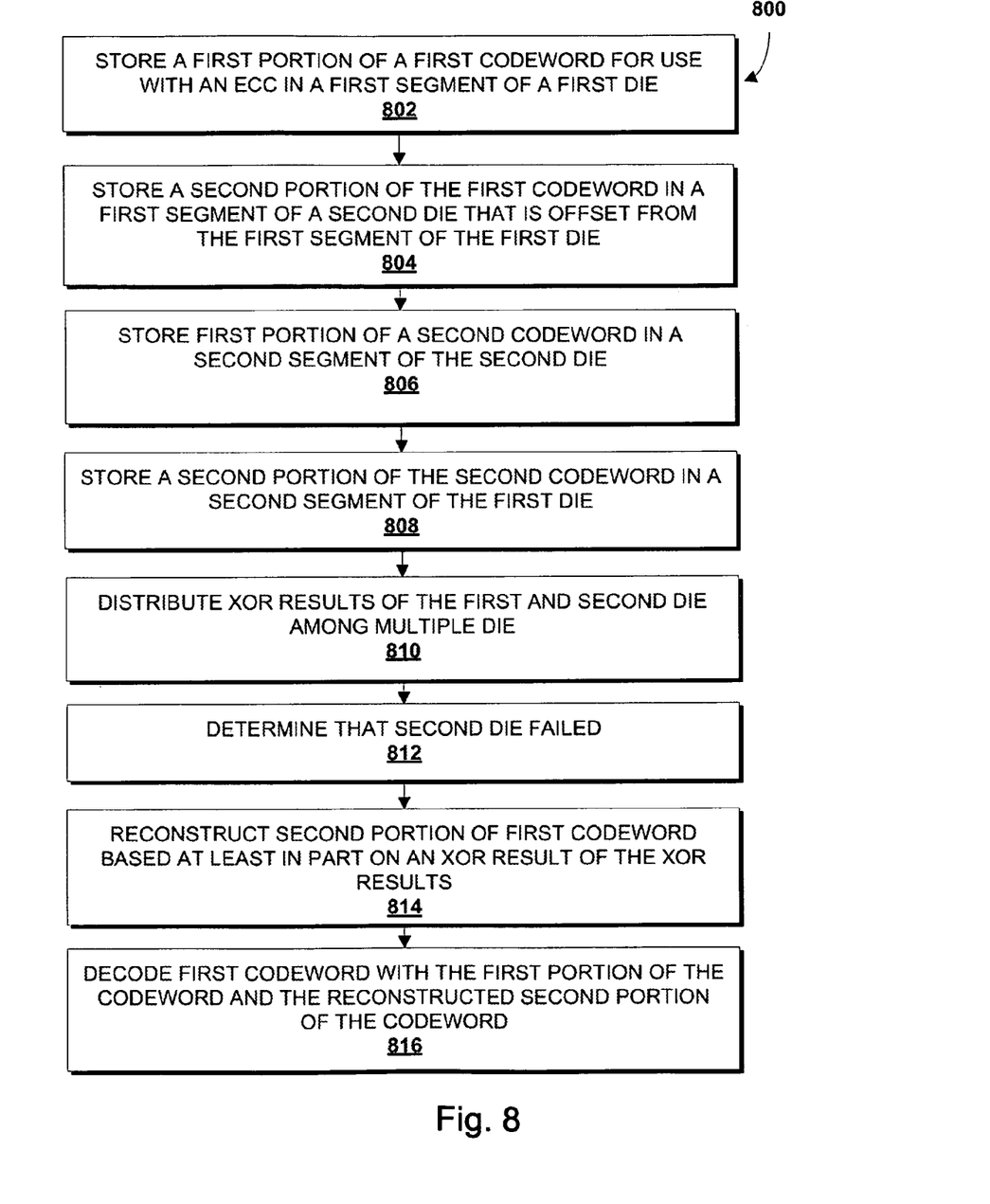
FIG. 8 schematically depicts an example method, in accordance with various embodiments.

An example method 800 that may be implemented by a memory controller such as memory controller 12 is shown in FIG. 8. At block 802, a first portion of a first codeword for use with an ECC may be stored, e.g., by memory controller 12, in a first segment of a first die of NVM. For example, CW0a may be stored in the top left segment of DIE #1 of FIG. 1. At block 804, a second portion of the first codeword may be stored, e.g., by memory controller 12, in a first segment of a second die of the NVM that is offset from the first segment of the first die. For example, CW0b may be stored in the second segment from the left on the top row of DIE #2.

At block 806, a first portion of a second codeword may be stored, e.g., by memory controller 12, in a second segment of the second die (e.g., CW2a). At block 808, a second portion of the second codeword may be stored, e.g., by memory controller 12, in a second segment of the first die (e.g., CW2b). In various embodiments, the second segment of the second die may be offset from the second segment of the first die.

In various embodiments, the first segment of the first die (e.g., CW0a on DIE #1) may be vertically aligned with the second segment of the second die (e.g., CW2a on DIE #2). Likewise, in various embodiments, the second segment of the first die (e.g., CW2b on DIE #1) may be vertically aligned with the first segment of the second die, (e.g., CW0b on DIE #2).

At block 810, XOR results of the contents of the first and second die may be distributed, e.g., by memory controller 12, among multiple die, as shown in FIGS. 5-7. In various embodiments, the NVM may be NAND flash memory. At block 812, it may be determined that the second die failed. At block, 814 the second portion of the first codeword (which was stored on the failed second die) may be reconstructed based at least in part on an XOR result, e.g., as shown in FIGS. 5-7. At block 816, the first portion of the first codeword and the reconstructed second portion of the first codeword may be decoded to reconstruct the first codeword.

Figure 9:
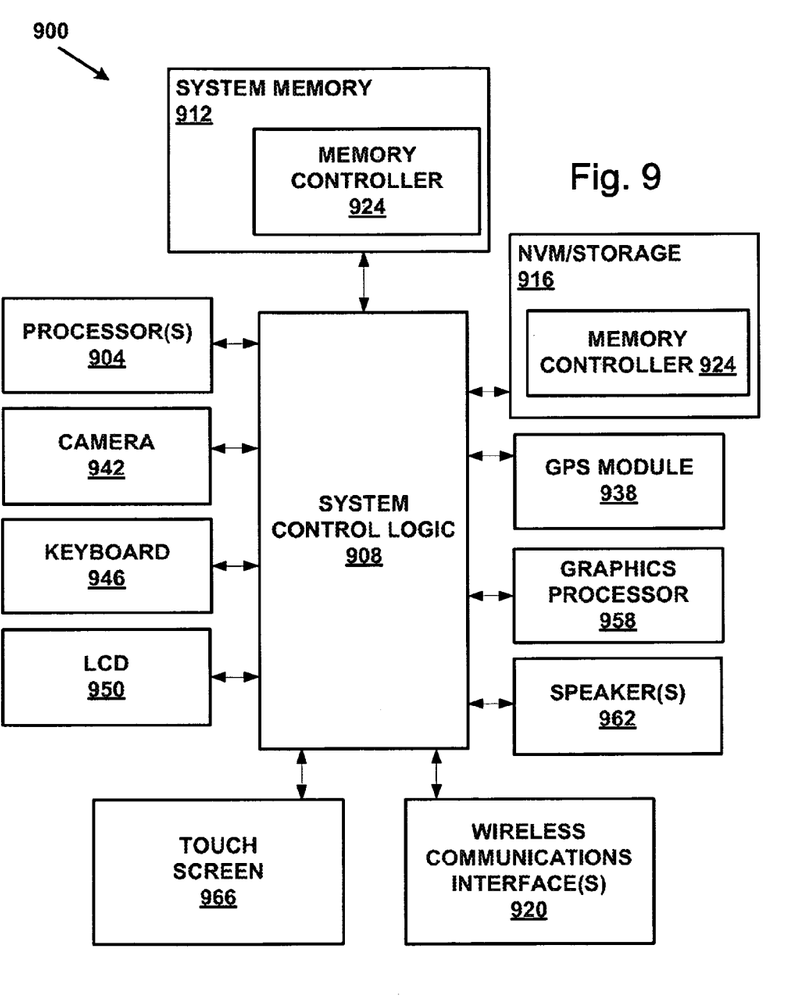
FIG. 9 schematically depicts an example system, in accordance with various embodiments.

The techniques and apparatuses described herein may be implemented into a system using suitable hardware and/or software to configure as desired. FIG. 9 illustrates, for one embodiment, an example system 900 comprising one or more processor(s) 904, system control logic 908 coupled to at least one of the processor(s) 904, system memory 912 coupled to system control logic 908, non-volatile memory (NVM)/storage 916 coupled to system control logic 908, and one or more communications interface(s) 920 coupled to system control logic 908.

System control logic 908 for one embodiment may include any suitable interface controllers to provide for any suitable interface to at least one of the processor(s) 904 and/or to any suitable device or component in communication with system control logic 908.

System control logic 908 for one embodiment may include one or more memory controller(s) to provide an interface to system memory 912. System memory 912 may be used to load and store data and/or instructions, for example, for system 900. System memory 912 for one embodiment may include any suitable volatile memory, such as suitable dynamic random access memory ("DRAM"), for example.

System control logic 908 for one embodiment may include one or more input/output ("I/O") controller(s) to provide an interface to NVM/storage 916 and communications interface(s) 920.

NVM/storage 916 may be used to store data and/or instructions, for example. NVM/storage 916 may include any suitable non-volatile memory, such as flash and/or NAND memory, hybrid memory devices and solid state memory, for example.

The NVM/storage 916 may include a storage resource physically part of a device on which the system 900 is installed or it may be accessible by, but not necessarily a part of, the device. For example, the NVM/storage 916 may be accessed over a network via the communications interface(s) 920.

System memory 912 and NVM/storage 916 may include, in particular, temporal and persistent copies of memory controller 924, respectively. The memory controller 924 may include instructions that when executed by at least one of the processor(s) 904 result in the system 900 distributing portions of ECC codewords among multiple die of memory, as described above. In some embodiments, the memory controller 924 may additionally/alternatively be located in the system control logic 908.

Communications interface(s) 920 may provide an interface for system 900 to communicate over one or more network(s) and/or with any other suitable device. Communications interface(s) 920 may include any suitable hardware and/or firmware, such as a wireless network adapter. The communications interface(s) 920 may use one or more antenna(s).

For one embodiment, at least one of the processor(s) 904 may be packaged together with logic for one or more controller(s) of system control logic 908. For one embodiment, at least one of the processor(s) 904 may be packaged together with logic for one or more controllers of system control logic 908 to form a System in Package ("SiP"). For one embodiment, at least one of the processor(s) 904 may be integrated on the same die with logic for one or more controller(s) of system control logic 908. For one embodiment, at least one of the processor(s) 904 may be integrated on the same die with logic for one or more controller(s) of system control logic 908 to form a System on Chip ("SoC").

The system 900 may be a desktop or laptop computer, a mobile telephone, a smart phone, a tablet, a set top box, a game console, or any other device adapted to transmit or receive a wireless communication signal. In various embodiments, system 900 may have more or less components, and/or different architectures. For example, in FIG. 9, system 900 includes a GPS module 938, a camera 942, a keyboard 946, a liquid crystal display ("LCD") screen 950, a graphics processor 958, speakers 962, and a touch screen 966 (which in some cases may be the same as LCD screen 950). Camera 942 may be operated by processor(s) 904 to capture image data and store it in NVM/Storage 916.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims and the equivalents thereof.

The invention claimed is:

1. A device comprising:
   non-volatile memory including a first die and a second die; and
   a memory controller configured to store a first portion of a codeword for use with an error correcting code in a first segment of the first die and to store a second portion of the codeword in a first segment of the second die, wherein the first segment of the second die is offset from the first segment of the first die.

2. The device of claim 1, wherein the non-volatile memory is NAND flash memory.

3. The device of claim 1, wherein the codeword is a first codeword, and the memory controller is further configured to store a first portion of a second codeword for use with the error correcting code in a second segment of the second die, and to store a second portion of the second codeword in a second segment of the first die.

4. The device of claim 3, wherein the second segment of the second die is offset from the second segment of the first die.

5. The device of claim 4, wherein the first segment of the first die is vertically aligned with the second segment of the second die and the second segment of the first die is vertically aligned with the first segment of the second die.

6. The device of claim 1, wherein XOR results of contents of the first and second die are distributed among multiple die.

7. The device of claim 6, the memory controller is further configured to:
   determine that the second die has failed;
   reconstruct the second codeword portion based at least in part on an XOR result of the XOR results; and
   decode the codeword with the first portion of the codeword and the reconstructed second portion of the first codeword.

8. The device of claim 1, wherein the first segment of the second die is logically offset, by the memory controller, from the first segment of the first die.

9. A method, comprising:
   storing a first portion of a codeword for use with an error correcting code in a first segment of a first die of non-volatile memory; and
   storing a second portion of the codeword in a first segment of a second die of the non-volatile memory that is physically or logically offset from the first segment of the first die.

10. The method of claim 9, wherein the codeword is a first codeword, the method further comprising:
    storing a first portion of a second codeword for use with the error correcting code in a second segment of the second die; and
    storing a second portion of the second codeword in a second segment of the first die that is physically or logically offset from the second segment of the second die.

11. The method of claim 9, further comprising distributing XOR results of the first and second die among multiple die.

12. The method of claim 11, further comprising:
    determining that the second die has failed;
    reconstructing the second codeword portion based at least in part on an XOR result of the XOR results; and
    decoding the codeword with the first portion of the codeword and the reconstructed second portion of the first codeword.

13. The method of claim 10, wherein the first segment of the first die is vertically aligned with the second segment of the second die.

14. The method of claim 13, wherein the second segment of the first die is vertically aligned with the first segment of the second die.

15. The method of claim 9, wherein the non-volatile memory is NAND flash memory.

16. The method of claim 9, further comprising selectively implementing an error correcting code based on raw bit error rate variability among a population of devices.

17. A system comprising:
    one or more processors;
    non-volatile memory operably coupled to the one or more processors;
    a liquid crystal display screen operably coupled to the one or more processors; and
    a memory controller to be operated by the one or more processors and configured to store a first portion of a codeword for use with an error correcting code in a first segment of a first die of the non-volatile memory and to store a second portion of the codeword in a first segment of a second die of the non-volatile memory, wherein the first segment of the second die is logically or physically offset from the first segment of the first die.

18. The system of claim 17, wherein the non-volatile memory is NAND flash memory.

19. The system of claim 17, wherein the error correcting code is selected from a plurality of potential error correcting codes to account for raw bit error rate variability among a population of systems of which the system is a member.

20. The system of claim 17, wherein the codeword is a first codeword, and the memory controller is further configured to store a first portion of a second codeword for use with the error correcting code in a second segment of the second die, and to store a second portion of the second codeword in a second segment of the first die.

21. The system of claim 17, wherein XOR results of the contents of the first and second die are distributed among multiple die.

22. The system of claim 21, the memory controller is further configured to:
   determine that the second die has failed;
   reconstruct the second codeword portion based at least in part on an XOR result of the XOR results; and
   decode the codeword with the first portion of the codeword and the reconstructed second portion of the first codeword.

* * * * *

UNITED STATES PATENT AND TRADEMARK OFFICE
CERTIFICATE OF CORRECTION

Page 1 of 1

PATENT NO. : 9,092,349 B2
APPLICATION NO. : 13/991400
DATED : July 28, 2015
INVENTOR(S) : Schmidt et al.

It is certified that error appears in the above-identified patent and that said Letters Patent is hereby corrected as shown below:

In the Claims

Column 10
Line 9, Claim 7 "The device of claim 6, the memory ..." -- should read – "The device of claim 6, wherein the memory ..."

Column 11
Line 18, Claim 22 "The system of claim 21, the memory ..." -- should read – "The system of claim 21, wherein the memory ..."

Signed and Sealed this
Twelfth Day of April, 2016

Michelle K. Lee
*Director of the United States Patent and Trademark Office*